(12) United States Patent
Tanaka

(10) Patent No.: US 6,581,199 B2
(45) Date of Patent: Jun. 17, 2003

(54) ENGINEERING-CHANGE METHOD OF SEMICONDUCTOR CIRCUIT

(75) Inventor: Genichi Tanaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/950,802

(22) Filed: Sep. 13, 2001

(65) Prior Publication Data

US 2002/0129325 A1 Sep. 12, 2002

(30) Foreign Application Priority Data

Mar. 6, 2001 (JP) ........................ 2001-062339

(51) Int. Cl.[7] .................... G06F 9/455; G06F 17/50
(52) U.S. Cl. .............................. 716/11; 716/8
(58) Field of Search ........................ 716/1–14

(56) References Cited

U.S. PATENT DOCUMENTS

| | | | |
|---|---|---|---|
| 5,754,829 A | * 5/1998 | Motohiro et al. | 709/201 |
| 5,841,674 A | * 11/1998 | Johannsen | 716/12 |
| 5,953,236 A | * 9/1999 | Hossain et al. | 716/6 |
| 5,983,376 A | * 11/1999 | Narayanan et al. | 714/726 |
| 6,014,506 A | * 1/2000 | Hossain et al. | 716/11 |
| 6,226,777 B1 | * 5/2001 | Zhang | 716/5 |
| 2002/0162086 A1 | * 10/2002 | Morgan | 716/18 |

FOREIGN PATENT DOCUMENTS

| | | |
|---|---|---|
| JP | 10-269256 | 10/1998 |
| JP | 2000-003382 | 1/2000 |
| JP | 2000-242675 | 9/2000 |

* cited by examiner

*Primary Examiner*—Vuthe Siek
*Assistant Examiner*—Sun James Lin
(74) *Attorney, Agent, or Firm*—Burns, Doane, Swecker & Mathis, LLP

(57) ABSTRACT

An engineering-change method of a semiconductor circuit includes a P&R (placement and routing) step of conducting placement and routing and logical optimization using a first netlist to generate a second netlist and a first layout; an ECO (engineering-change order) step of making logical changes in design of the first netlist to generate a third netlist; an ECO-formal verification step of generating a fourth netlist by changing the second netlist such that the fourth netlist becomes logically equivalent to the third netlist; and another ECO step of generating a second layout by changing the first layout such that it matches the fourth netlist. This method can implement an engineering-change method of a semiconductor circuit capable of reducing the design period with eliminating design feedback to the logical optimization at the P&R step.

8 Claims, 15 Drawing Sheets

FIG.2A
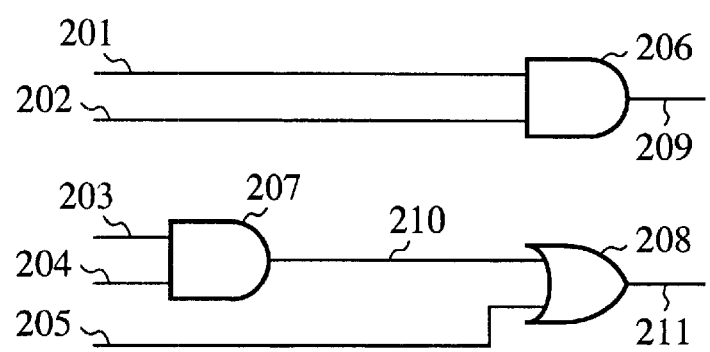
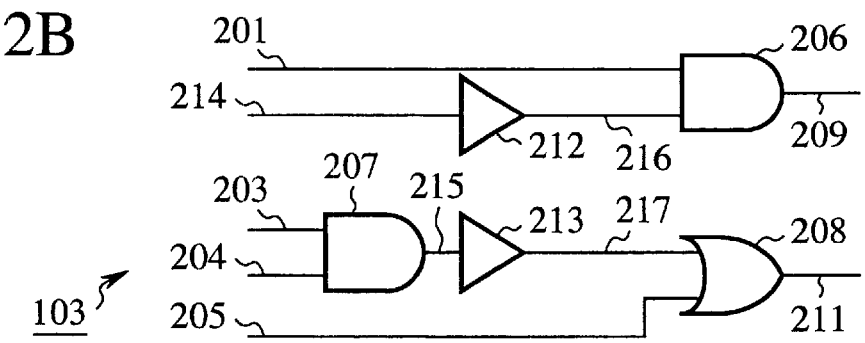
FIG.2B
FIG.2C
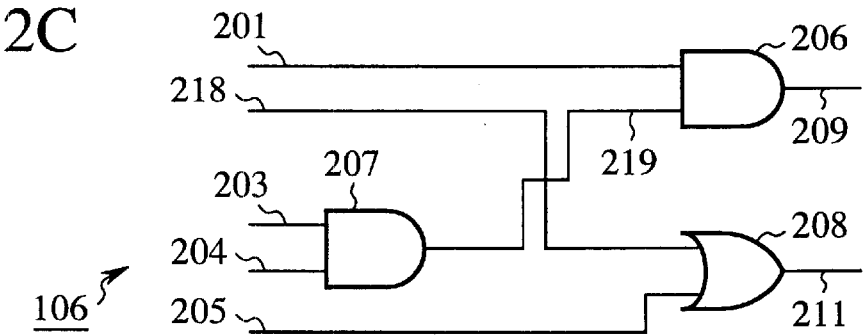
FIG.2D
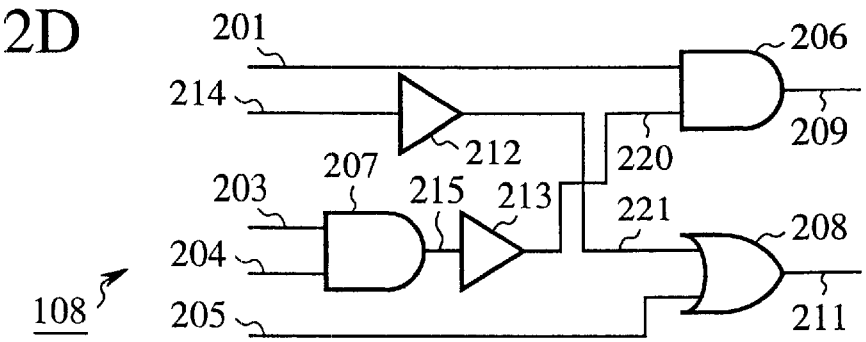

ENGINEERING-CHANGE METHOD OF SEMICONDUCTOR CIRCUIT

BACKGROUND OF THE INVENTION

1. Field of the Invention

The present invention relates to an engineering-change method of a semiconductor circuit at netlist changes after automatic placement and routing of a semiconductor circuit design.

2. Description of Related Art

FIG. 15 is a flowchart illustrating a conventional engineering-change method of a semiconductor circuit. In this figure, the reference numeral 1501 designates an original netlist. A P&R (placement and routing) process 1502 carries out placement and routing and logical optimization using the netlist 1501, and changes the netlist to meet constraints such as timings. The P&R process produces a netlist 1503 and a layout 1504. Subsequently, an ECO (Engineering Change Order) process 1505 carries out logical changes due to design problems and the like.

Here, the logical changes are sometimes made for the netlist 1501 when a layout engineer differs from a logic designer, or when it is difficult to read the netlist 1503 after the P&R process. The netlist produced by the logical changes of the netlist 1501 by the ECO process 1505 is a netlist 1506.

Subsequently, a P&R process 1507 carries out the placement and routing and the logical optimization using the netlist 1506, thereby making netlist changes to meet the constraints such as timings. The P&R process 1507 is the same as the P&R process 1502, and produces a netlist 1508 and a layout 1509 that are changed.

With the foregoing configuration, the conventional engineering-change method of a semiconductor circuit has the following problems. When the original netlist 1501 is changed after the P&R process 1502 carries out the logical changes such as the logical optimization in an LSI design, it is necessary for the P&R process 1507 to perform logical optimization or logical changes according to a manual, thereby prolonging a design period.

SUMMARY OF THE INVENTION

The present invention is implemented to solve the foregoing problem. It is therefore an object of the present invention to provide an engineering-change method of a semiconductor circuit capable of reducing the design period by making it possible to reflect logical changes in the design on a layout without making any design feedback even when a netlist is changed.

According to a first aspect of the present invention, there is provided an engineering-change method of a semiconductor circuit comprising: a placement and routing step of carrying out placement and routing and logical optimization using a first netlist to generate a second netlist and a first layout that undergo logical optimization; an engineering-change step of making logical changes in design for the first netlist to generate a third netlist; an engineering-change and formal verification step of conducting formal verification of the second netlist and the third netlist to generate a fourth netlist by changing the second netlist such that the fourth netlist becomes logically equivalent to the third netlist; and a layout generating step of generating a second layout by changing the first layout such that the second layout matches the fourth netlist.

According to a second aspect of the present invention, there is provided an engineering-change method of a semiconductor circuit comprising: a placement and routing step of carrying out placement and routing and logical optimization using a first netlist to generate a second netlist and a first layout that undergo logical optimization; an engineering-change step of making logical changes in design for the first netlist to generate a third netlist; and an engineering-change and formal verification/layout generating step of conducting formal verification of the second netlist and the third netlist to generate a fourth netlist by changing the second netlist such that the fourth netlist becomes logically equivalent to the third netlist, and of generating a second layout by changing the first layout such that the second layout matches the fourth netlist.

Here, the placement and routing step may generate the second netlist and the first layout such that they satisfy timing constraints or timing information including timing library information on each cell, and the engineering-change and formal verification step may generate the fourth netlist such that it satisfies the timing information.

The placement and routing step may generate the second netlist and the first layout such that they satisfy timing constraints or timing information including timing library information on each cell, and the engineering-change and formal verification/layout generating step may generate the fourth netlist such that it satisfies the timing information.

The placement and routing step may generate the second netlist and the first layout such that they satisfy crosstalk constraints or crosstalk information including crosstalk library information on each cell, and the engineering-change and formal verification step may generate the fourth netlist such that it satisfies the crosstalk information.

The placement and routing step may generate the second netlist and the first layout such that they satisfy crosstalk constraints or crosstalk information including crosstalk library information on each cell, and the engineering-change and formal verification/layout generating step may generate the fourth netlist such that it satisfies the crosstalk information.

The engineering-change method of a semiconductor circuit may further comprise a selection step of selecting, when the engineering-change and formal verification step generates a plurality of fourth netlists, one of the plurality of fourth netlists.

The engineering-change method of a semiconductor circuit may further comprise a selection step of selecting, when the engineering-change and formal verification/layout generating step generates a plurality of fourth netlists, one of the plurality of fourth netlists.

BRIEF DESCRIPTION OF THE DRAWINGS

FIGS. 2A–2D are circuit diagrams illustrating examples of netlist changes in the embodiment 1 in accordance with the present invention;

DETAILED DESCRIPTION OF THE PREFERRED EMBODIMENTS

The invention will now be described with reference to the accompanying drawings.

Embodiment 1

Figure 1:
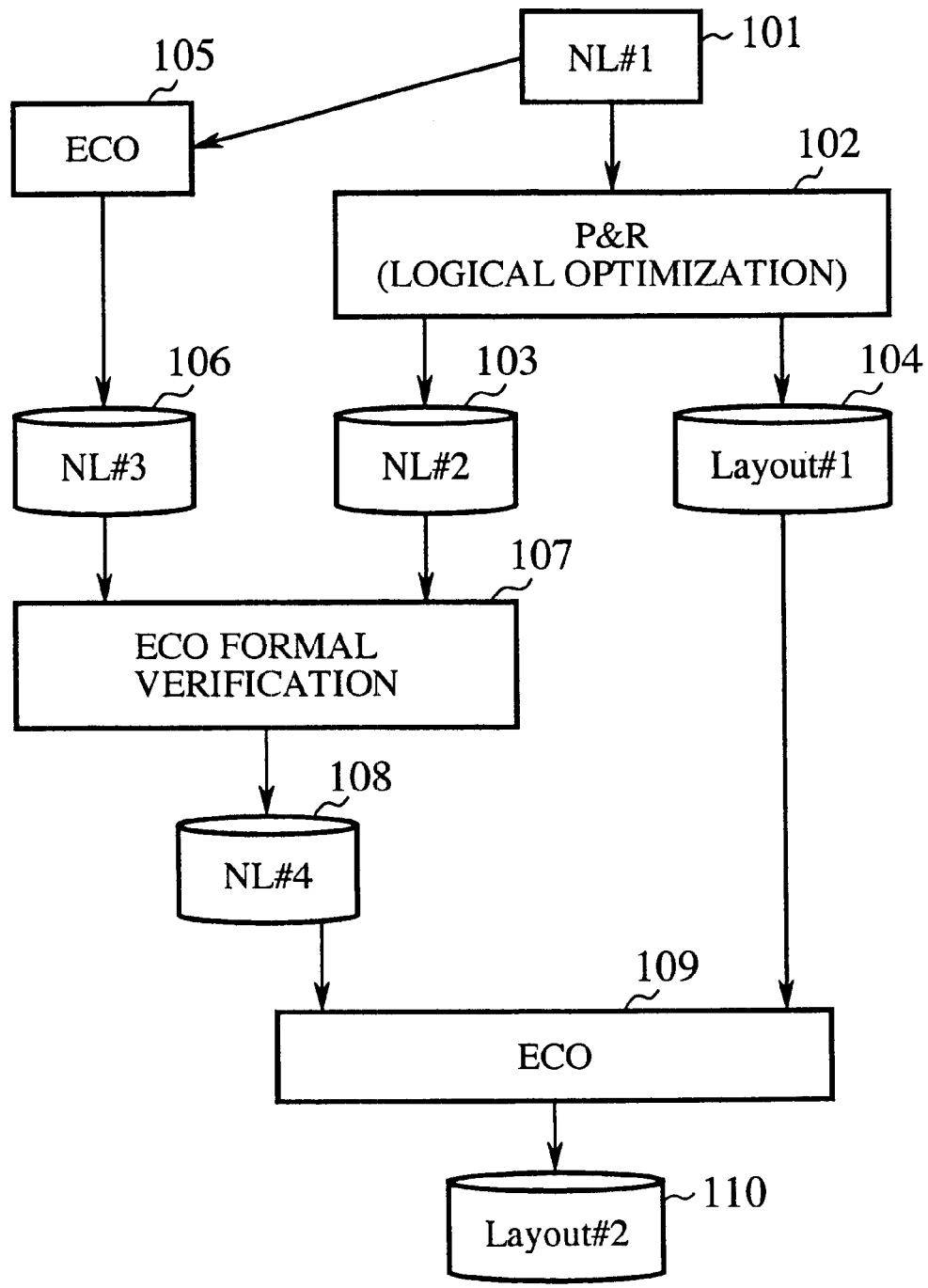
FIG. 1 is a flowchart illustrating an engineering-change method of a semiconductor circuit of an embodiment 1 in accordance with the present invention.

FIG. 1 is a flowchart illustrating an engineering-change method of a semiconductor circuit of an embodiment 1 in accordance with the present invention. The present embodiment 1 takes the following steps when netlist changes take place: it conducts verification of the logical equivalence between a current netlist and a netlist changed; changes the current netlist so that it becomes logically equivalent to the netlist changed; and produces a layout in accordance with the changed current netlist by a conventional ECO process.

In FIG. 1, the reference numeral 101 designates an original netlist. A P&R (placement and routing) process 102 carries out the placement and routing and the logical optimization using the netlist 101, and makes netlist changes to meet the constraints such as timings. The P&R process 102 produces a changed netlist 103 and a layout 104. Subsequently, an ECO (Engineering Change Order) process 105 provides logical changes because of design problems or the like.

The present invention is not necessary when the logical changes are performed for the netlist 103. However, when a layout engineer differs from a logic designer, or when the netlist 103 after the P&R process is difficult to read, the netlist 101 sometimes undergoes the logical changes. The ECO process 105 that provides the logical changes to the netlist 101 generates a netlist 106.

Subsequently, an ECO-formal verification process 107 conducts a formal verification of the netlist 103 and the netlist 106, and changes the netlist 103 according to the verification results such that the netlist 103 becomes logically equivalent to the netlist 106. The netlist produced by the changes is a netlist 108. Furthermore, an ECO process (layout generating process) 109 which is a conventional placement and routing tool carries out layout changes of the portions to be changed of the netlist 108 and the layout 104. The layout produced by the changes is a layout 110.

FIGS. 2A–2D are circuit diagrams illustrating examples of the netlist changes in the embodiment 1 in accordance with the present invention. FIG. 2A illustrates a part of the original netlist 101 with input nets 201–205. The nets 201 and 202 are input to a cell 206, the output of which is a net 209. The nets 203 and 204 are input to a cell 207, the output of which is a net 210. The net 210 and the net 205 are input to a cell 208, the output of which is a net 211. FIG. 2B illustrates a netlist 103 changed by the P&R process 102. A comparison with FIG. 2A shows that buffers 212 and 213 are added. These buffers are cells that are added to improve timings, for example. The net 202 is divided by the buffer 212 so that the input side of the buffer 212 is a net 214 and the output side thereof is a net 216. Likewise, the 210 is divided by the buffer 213 so that the input side of the buffer 213 is a net 215 and the output side thereof is a net 217.

FIG. 2C illustrates the resultant netlist 106 produced by changing the netlist 101 by the ECO process 105. A comparison with FIG. 2A shows that the cells to which the net 202 and net 210 are input are exchanged. The net 202 is input to the cell 208 as a net 218, and the net 210 is input to the cell 206 as a net 219. The ECO-formal verification process 107 compares and verifies the logical equivalence between the netlist 103 and the netlist 106. FIG. 2D illustrates a resultant netlist 108 in which the differences between the two lists are canceled out. It is shown from FIG. 2D that the connections of the net 216 and net 217 of FIG. 2B are exchanged so that the net 216 is connected to an input of the cell 208 as a net 221, and the net 217 is connected to an input of the cell 206 as a net 220.

As described above, the present embodiment 1 can reduce the design period. This is because even when logical changes in design take place in the original netlist 101 after the P&R process 102 generates from the netlist 101 the netlist 103 and layout 104 that are logically optimized, the P&R process does not carry out the logical optimization again, but the ECO-formal verification process 107 generates the netlist 108 by changing the netlist 103 that is logically optimized so that it becomes logically equivalent to the netlist 106 that undergoes the logical changes, and the ECO process 109 generates the layout 110 by changing the layout 104 that is logically optimized such that it matches the netlist 108, thereby making it possible to reflect the logical changes in design on the layout 110 without the feedback in the design.

Embodiment 2

Figure 3:
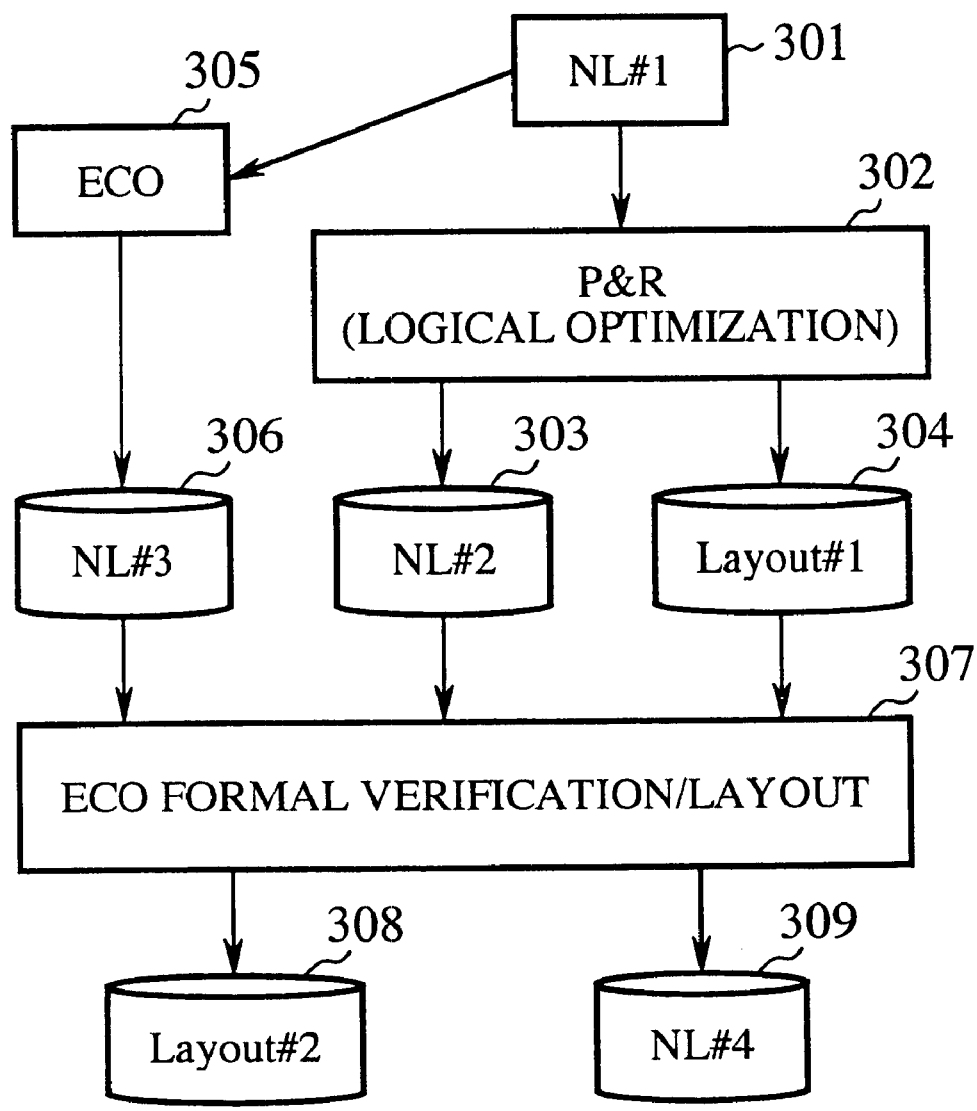
FIG. 3 is a flowchart illustrating an engineering-change method of a semiconductor circuit of an embodiment 2 in accordance with the present invention.

FIG. 3 is a flowchart illustrating an engineering-change method of a semiconductor circuit of an embodiment 2 in accordance with the present invention. The present embodiment 2 conducts, when netlist changes take place, the verification of logical equivalence with the current netlist, changes the current netlist such that it becomes logically equivalent to the netlist changes, and generates the layout.

In FIG. 3, the reference numeral 301 designates an original netlist. A P&R process 302 carries out the placement and routing using the netlist 301, and netlist changes to meet the constraints such as timings. The P&R process 302 produces a changed netlist 303 and a layout 304. Subsequently, an ECO process 305 makes logical changes because of design problems or the like.

The present invention is not necessary when the logical changes are performed for the netlist 303. However, when a layout engineer differs from a logic designer, or when the netlist 303 after the P&R process is difficult to read, it is sometimes necessary to carry out the logical changes of the netlist 301. A netlist produced by the ECO process 305 that makes the logical changes of the netlist 301 is a netlist 306.

Subsequently, an ECO-formal verification/layout generating process 307 conducts a formal verification of the netlist 303 and the netlist 306, and changes the netlist 303 according to the verification results, such that the netlist 303 becomes logically equivalent to the netlist 306. Furthermore, the ECO-formal verification/layout generating process 307 implements a layout according to the change results, and conducts a verification whether the changes are possible in the layout. The layout produced by the changes is a layout 308, and the netlist after the changes is a netlist 309.

Since examples of the changes in the netlists are analogous to those of FIGS. 2A–2D, the description thereof it omitted here.

Figure 4A:
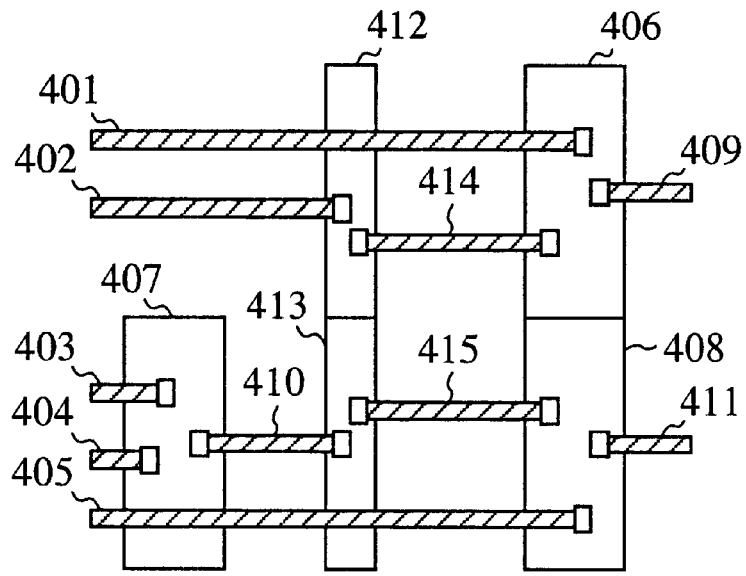
FIGS. 4A and 4B are diagrams illustrating examples of layout changes in the embodiment 2 in accordance with the present invention.
Figure 4B:
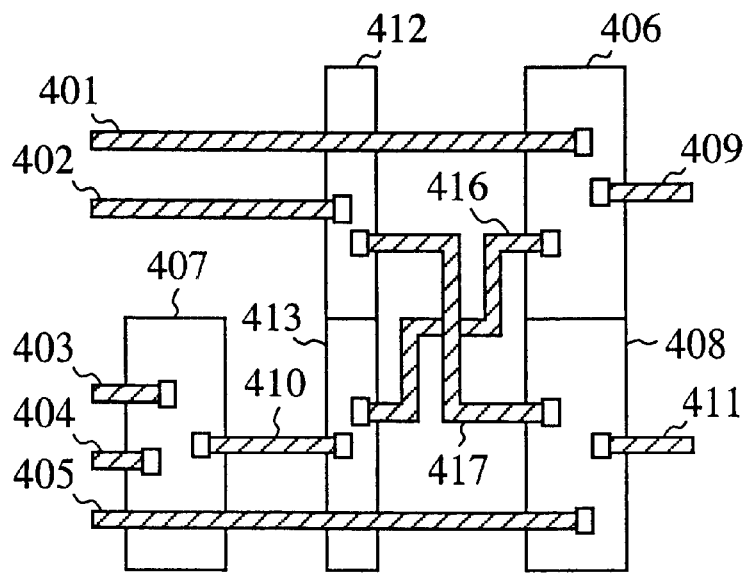

FIGS. 4A and 4B are diagrams showing an example of layout changes in the embodiment 2 in accordance with the present invention, which show examples of layout changes when the netlist changes occur as illustrated in FIGS. 2A–2D.

FIG. 4A illustrates a layout based on the netlist 303 after the changes by the P&R process 302. The reference numerals 401–405 each designate an input net. A net 402 is an input to a cell 412, the output net of which is a net 414. The nets 401 and 414 are input to a cell 406, the output of which is a net 409. The nets 403 and 404 are input to a cell 407, the output of which is a net 410. The net 410 is input to a cell 413, the output of which is a net 415. The net 415 and the net 405 are input to a cell 408, the output of which is a net 411. FIG. 4A illustrates a result of these placement and routing of the netlist. The nets are drawn as segments of a wiring pattern on the layout, and the cells are drawn as a layout diagram of the cells.

FIG. 4B illustrates a layout 308 implemented by the ECO-formal verification/layout generating process 307. It is shown from FIG. 4B that the connections of the nets 414 and 415 are exchanged so that their wiring pattern is also changed. The changed result is nets 416 and 417. Thus, the net 416 is the output of the cell 413 and the input to the cell 406, and the net 417 is the output of the cell 412 and the input to the cell 408.

As described above, the present embodiment 2 can reduce the design period. This is because even when logical changes in design take place in the original netlist 301 after the P&R process 302 generates from the netlist 301 the netlist 303 and layout 304 that are logically optimized, the P&R process does not carry out the logical optimization again, but the ECO-formal verification/layout generating process 307 generates the netlist 309 by changing the netlist 303 that is logically optimized so that the netlist 309 becomes logically equivalent to the netlist 306 that undergoes the logical changes, and then generates the layout 308 by changing the layout 304 that is logically optimized such that the layout 308 matches the netlist 309, thereby making it possible to reflect the logical changes in design on the layout 308 without the feedback in the design.

Embodiment 3

Figure 5:
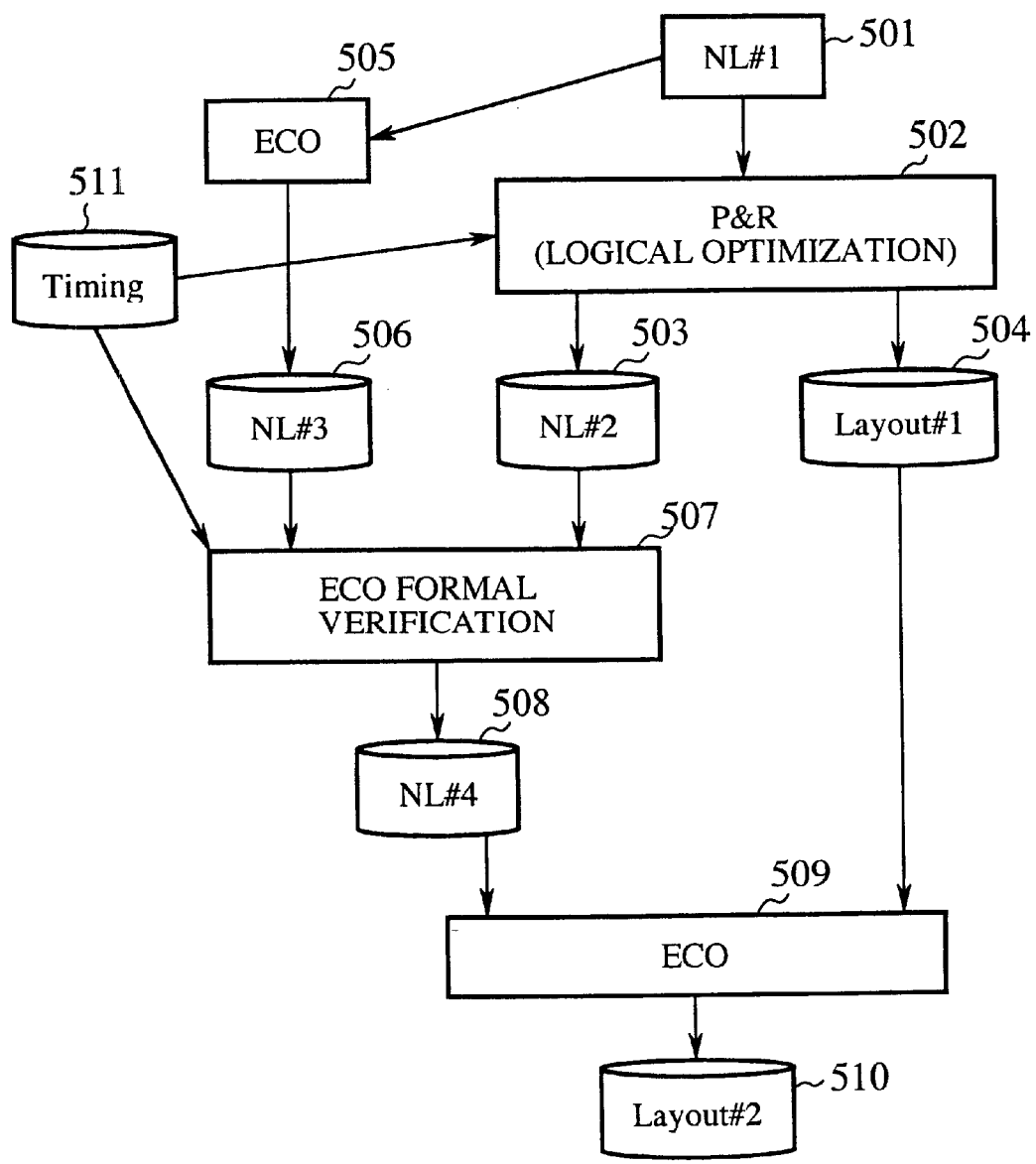
FIG. 5 is a flowchart illustrating an engineering-change method of a semiconductor circuit of an embodiment 3 in accordance with the present invention.

FIG. 5 is a flowchart illustrating an engineering-change method of a semiconductor circuit of an embodiment 3 in accordance with the present invention. The present embodiment 3 is an example of considering timing information at the netlist changes in the foregoing embodiment 1. For example, the netlist changes are made such that the timing slack becomes maximum.

In FIG. 5, the reference numeral 501 designates an original netlist. A P&R process 502 carries out the placement and routing using the netlist 501, and netlist changes to meet the constraints such as timings. The timing constraints and timing library information on each cell and the like used in this case constitute timing information 511. The P&R process 502 produces a changed netlist 503 and a layout 504. Subsequently, an ECO process 505 makes logical changes because of design problems or the like. A netlist produced by the ECO process 505 that makes logical changes of the netlist 501 is a netlist 506.

Subsequently, an ECO-formal verification process 507 conducts a formal verification of the netlists 503 and 506, and changes the netlist 503 according to the verification results such that it becomes logically equivalent to the netlist 506. In this case, the netlist changes are made by reading the timing information 511 to prevent timing problems. The netlist produced by the changes is a netlist 508. Furthermore, an ECO process 509 which is a conventional placement and routing tool carries out layout changes of the portions to be changed of the netlist 508 and the resultant layout 504. The layout produced by the changes is a layout 510.

Figure 6A:
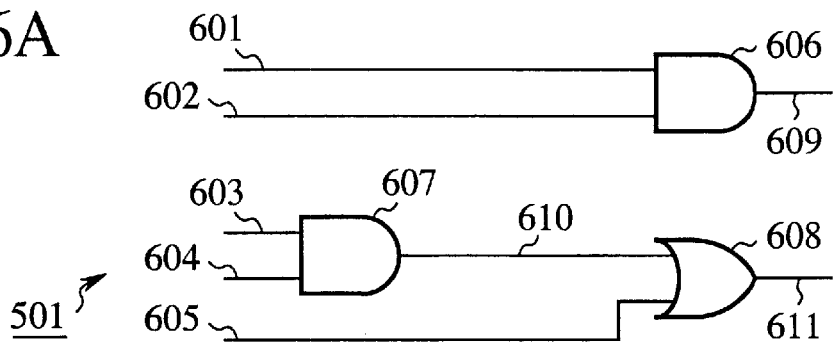
FIGS. 6A–6D are circuit diagrams illustrating examples of netlist changes in the embodiment 3 in accordance with the present invention.
Figure 6B:
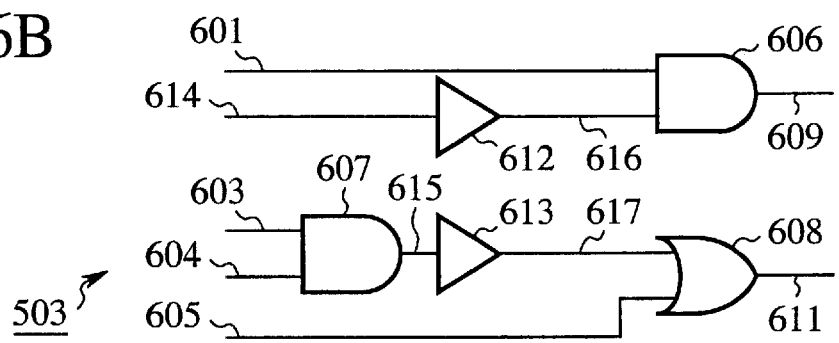

FIGS. 6A–6D are circuit diagrams illustrating examples of the netlist changes in the embodiment 3 in accordance with the present invention. FIG. 6A illustrates a part of the original netlist 501 with input nets 601–605. The nets 601 and 602 are input to a cell 606, the output of which is a net 609. The nets 603 and 604 are input to a cell 607, the output of which is a net 610. The nets 610 and 605 are input to a cell 608, the output of which is a net 611. FIG. 6B illustrates a resultant netlist 503 changed by the P&R process 502. A comparison with FIG. 6A shows that buffers 612 and 613 are added. These buffers are cells that are added to improve timings, for example. The net 602 is divided by the buffer 612 so that the input side of the buffer 612 is a net 614, and the output side thereof is a net 616. Likewise, the 610 is divided by the buffer 613 so that the input side of the buffer 613 is a net 615, and the output side thereof is a net 617.

Figure 6C:
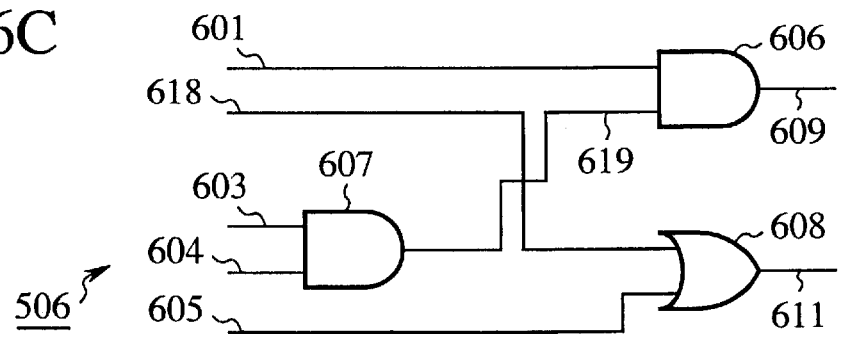
Figure 6D:
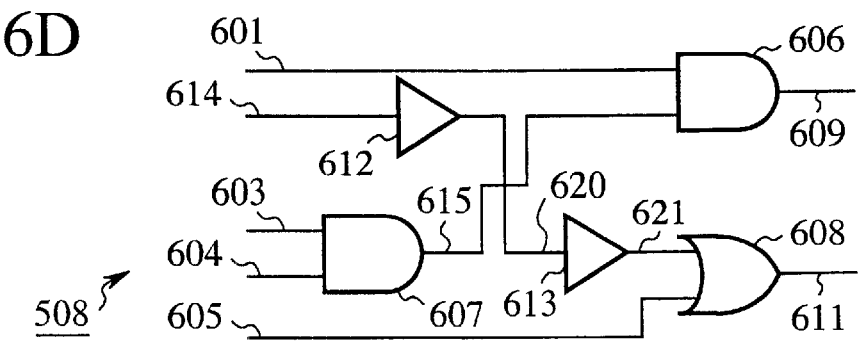

FIG. 6C illustrates the resultant netlist 506 produced by changing the netlist 501 by the ECO process 505. A comparison with FIG. 6A shows that the cells to which the net 602 and the net 610 are input are exchanged. The net 602 is input to the cell 608 as a net 618, and the net 610 is input to the cell 606 as a net 619. The ECO-formal verification process 507 compares and verifies the logical equivalence between the netlists 503 and 506. FIG. 6D illustrates the resultant netlist 508 in which the differences between the two lists are canceled out. It is shown from FIG. 6D that the connections of the nets 616 and 617 of FIG. 6B are exchanged: The net 616 is connected to an input of the cell 613 as a net 620, and the output of the cell 613 is input to the cell 608 as a net 621; and the net 615 is directly connected to an input of the cell 606. The long wire length of the path from the net 614 to the cell 608 requires the two buffers as repeaters. In contrast, as for the path from the cell 607 to the cell 606, it is better not to insert any buffer because the two cells are placed close to each other, and hence the delay time is reduced without the buffer. Thus, the interconnections between them differ from those of FIGS. 2A–2D.

As described above, the present embodiment 3 can achieve the logical optimization and logical changes in design, considering the timing information.

Embodiment 4

Figure 7:
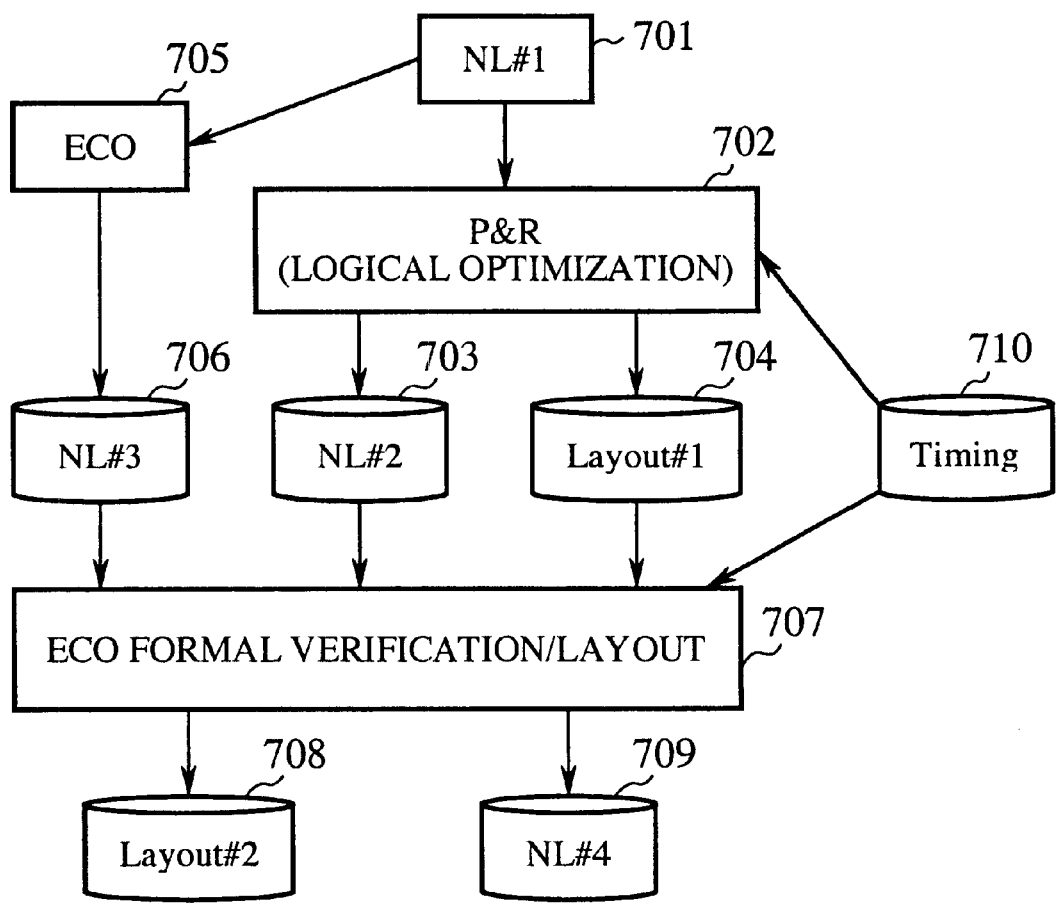
FIG. 7 is a flowchart illustrating an engineering-change method of a semiconductor circuit of an embodiment 4 in accordance with the present invention.

FIG. 7 is a flowchart illustrating an engineering-change method of a semiconductor circuit of an embodiment 4 in accordance with the present invention. The present embodiment 4 is an example of considering timing information at the netlist changes in the foregoing embodiment 2. For example, the netlist changes are made such that the timing slack becomes maximum.

In FIG. 7, the reference numeral 701 designates an original netlist. A P&R process 702 carries out the placement and routing using the netlist 701, and netlist changes to meet the constraints such as timings. The timing constraints and timing library information on each cell and the like used in this case constitute timing information 710. The P&R process 702 produces a changed netlist 703 and a layout 704. Subsequently, an ECO process 705 makes logical changes because of design problems or the like. A netlist produced by the ECO process 705 that makes logical changes of the netlist 701 is a netlist 706.

Subsequently, an ECO-formal verification/layout generating process 707 conducts a formal verification of the netlists 703 and 706, and changes the netlist 703 according to the verification results such that it becomes logically equivalent to the netlist 706. In this case, the netlist changes are made by reading the timing information 710 to prevent timing problems. The resultant netlist produced by the changes is a netlist 709. According to the results of the changes, the layout is implemented with verifying whether the changes of the layout are possible. The resultant layout is a layout 708.

Figure 8A:
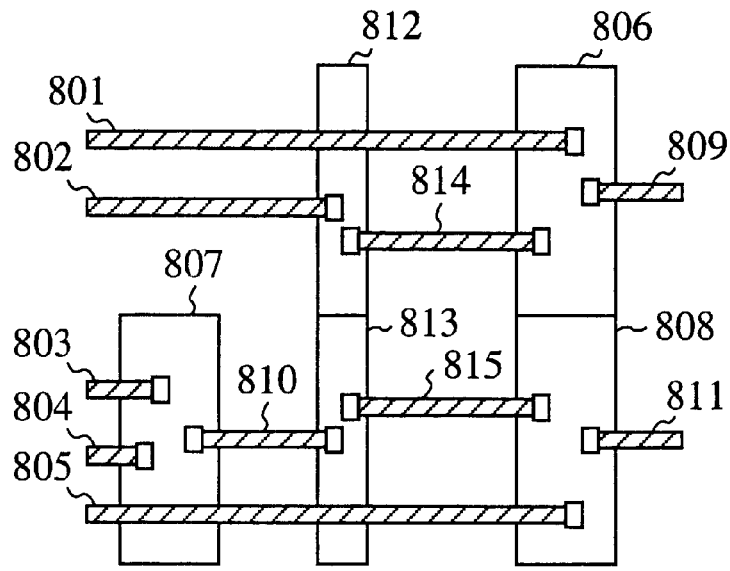
FIGS. 8A and 8B are diagrams illustrating examples of layout changes in the embodiment 4 in accordance with the present invention.
Figure 8B:
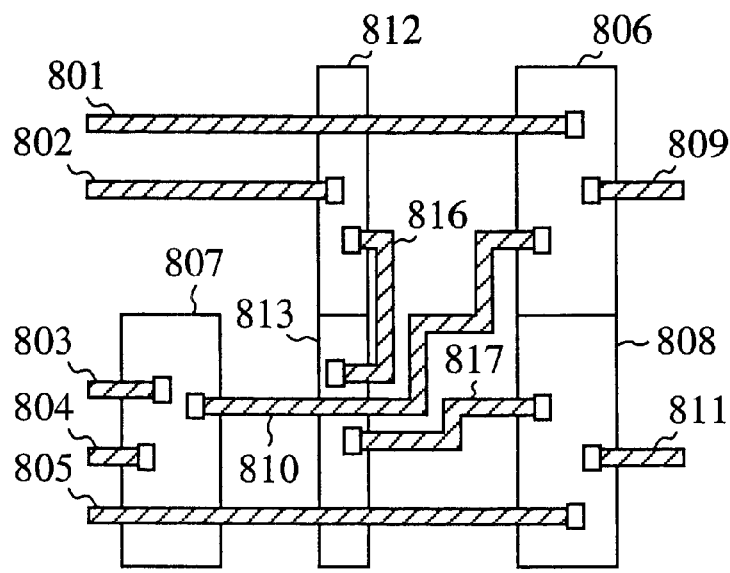

FIGS. 8A and 8B are diagrams showing an example of layout changes in the embodiment 4 in accordance with the present invention.

FIG. 8A illustrates a layout based on the netlist 703 after the changes by the P&R process 702. Reference numerals 801–805 each designate an input net. The net 802 is input to a cell 812, the output net of which is a net 814. The nets 801 and 814 are input to a cell 806, the output of which is a net 809. The nets 803 and 804 are input to a cell 807, the output of which is a net 810. The net 810 is input to a cell 813, the output of which is a net 815. The net 815 and the net 805 are input to a cell 808, the output of which is a net 811. FIG. 8A illustrates a result of carrying out the placement and routing of the netlist. The nets are drawn as segments of a wiring pattern on the layout, and the cells are drawn as a layout diagram of the cells.

FIG. 8B illustrates a layout 708 implemented by the ECO-formal verification/layout generating process 707. It is shown from FIG. 8B that the connections of the nets 814 and 815 are changed so that their wiring pattern is also changed. The changed result is nets 816 and 817. The net 816 is the output of the cell 812 and the input to the cell 813, and the net 817 is the output of the cell 813 and the input to the cell 808. The net 810 is the output of the cell 807, and is directly connected to the cell 806. The long wire length of the path from the net 802 to the cell 808 requires the buffers as repeaters. In contrast, as for the path from the cell 807 to the cell 806, it is better not to insert any buffer because the two cells are placed close to each other, and hence the delay time is reduced without the buffer. Thus, the interconnections between them differ from those of FIGS. 4A and 4B.

As described above, the present embodiment 4 can achieve the logical optimization and logical changes in design with considering the timing information.

Embodiment 5

Figure 9:
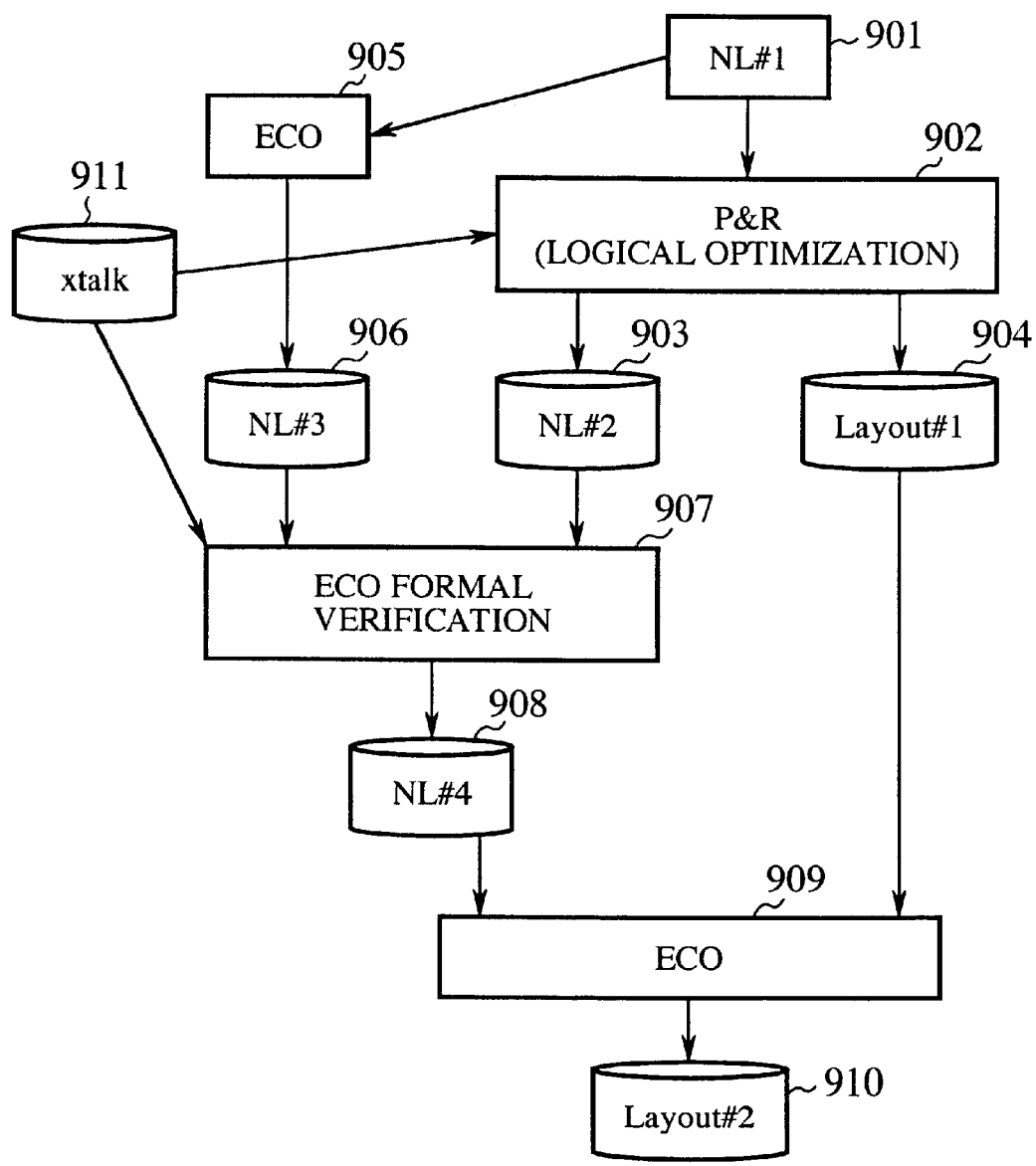
FIG. 9 is a flowchart illustrating an engineering-change method of a semiconductor circuit of an embodiment 5 in accordance with the present invention.

FIG. 9 is a flowchart illustrating an engineering-change method of a semiconductor circuit of an embodiment 5 in accordance with the present invention. The present embodiment 5 is an example of considering crosstalk information at the netlist changes in the foregoing embodiment 1. For example, the netlist changes are made by adjusting cell driving strength to prevent the crosstalk from taking place.

In FIG. 9, the reference numeral 901 designates an original netlist. A P&R process 902 carries out the placement and routing using the netlist 901, and netlist changes to meet the constraints such as crosstalk. The crosstalk constraints and crosstalk library information on each cell and the like used in this case constitute crosstalk information 911. The P&R process 902 produces a changed netlist 903 and a layout 904. Subsequently, an ECO process 905 makes logical changes because of design problems or the like. A resultant netlist produced by the ECO process 905 that makes the logical changes of the netlist 901 is a netlist 906.

Subsequently, an ECO-formal verification process 907 conducts the formal verification of the netlists 903 and 906, and changes the netlist 903 according to the verification results such that the netlist 903 becomes logically equivalent to the netlist 906. In this case, the netlist changes are made by reading the crosstalk information 911 to prevent crosstalk problems. The resultant netlist produced by the changes is a netlist 908. Furthermore, an ECO process 909 which is a conventional placement and routing tool carries out layout changes of the portions to be changed of the netlist 908 and the layout 904. The layout produced by the changes is a layout 910.

Figure 10A:
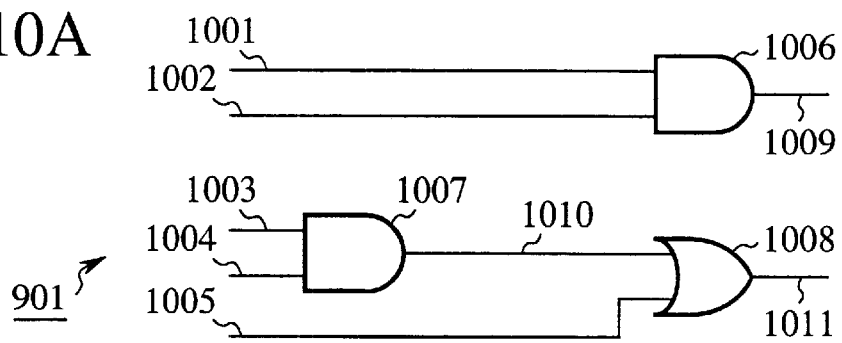
FIGS. 10A–10D are circuit diagrams illustrating examples of netlist changes in the embodiment 5 in accordance with the present invention.
Figure 10B:
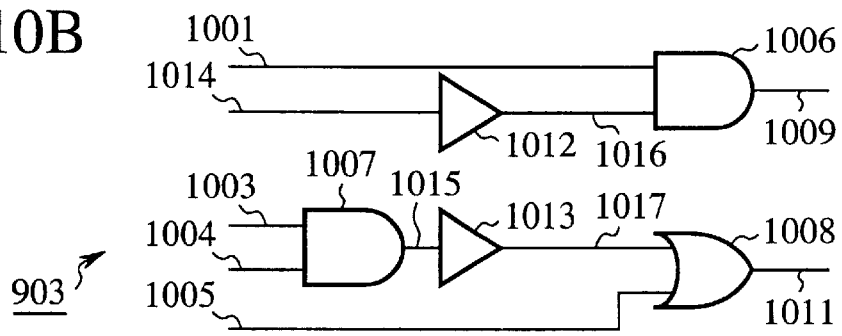

FIGS. 10A–10D are circuit diagrams illustrating examples of the netlist changes in the embodiment 5 in accordance with the present invention. FIG. 10A illustrates a part of the original netlist 901 with input nets 1001–1005. The nets 1001 and 1002 are input to a cell 1006, the output of which is a net 1009. The nets 1003 and 1004 are input to a cell 1007, the output of which is a net 1010. The nets 1010 and 1005 are input to a cell 1008, the output of which is a net 1011. FIG. 10B illustrates a netlist 903 changed by the P&R process 902. A comparison with FIG. 10A shows that buffers 1012 and 1013 are added. These buffers are cells that are added to improve crosstalk, for example. The net 1002 is divided by a buffer 1012 so that the input side of the buffer 1012 is a net 1014, and the output side thereof is a net 1016. Likewise, the 1010 is divided by a buffer 1013 so that the input side of the buffer 1013 is a net 1015, and the output side thereof is a net 1017.

Figure 10C:
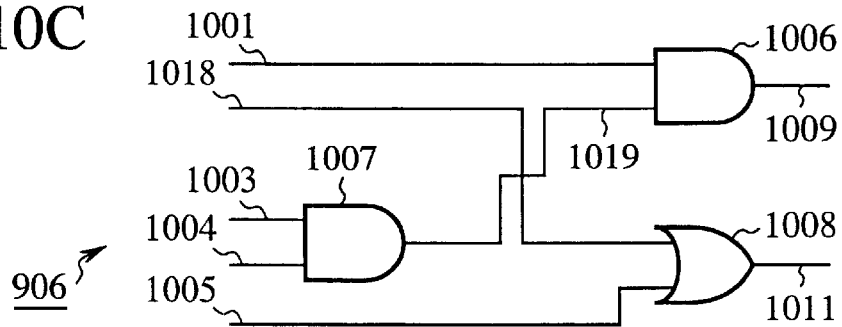
Figure 10D:
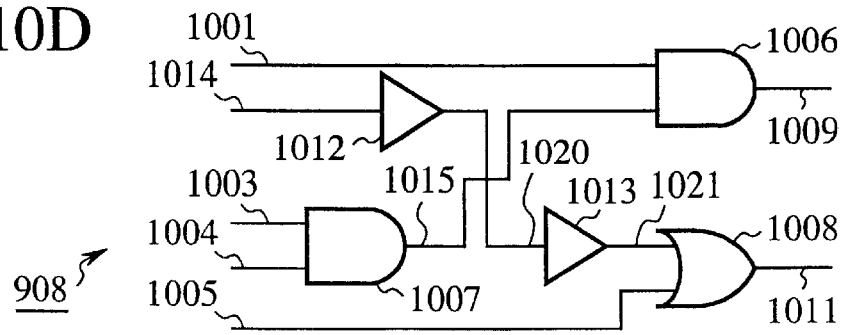

FIG. 10C illustrates the resultant netlist 906 produced by changing the netlist 901 by the ECO process 905. A comparison with FIG. 10A shows that the cells to which the net 1002 and net 1010 are input are exchanged. The net 1002 is input to the cell 1008 as a net 1018, and the net 1010 is input to the cell 1006 as a net 1019. The ECO-formal verification process 907 compares and verifies the logical equivalence between the netlists 903 and 906. FIG. 10D illustrates the resultant netlist 908 in which the differences between the two lists are canceled out. It is shown from FIG. 10D that the connections of the nets 1016 and 1017 of FIG. 10B are exchanged: The net 1016 is connected to an input of the cell 1013 as a net 1020, and the output of the cell 1013 is input to the cell 1008 as a net 1021; and the net 1015 is directly connected to an input of the cell 1006. The long wire length of the path from the net 1014 to the cell 1008 requires the two buffers as repeaters. In contrast, as for the path from the cell 1007 to the cell 1006, it is better not to insert any buffer because the two cells are placed close to each other, and hence the delay time is reduced without the buffer. Thus, the interconnections between them differ from those of FIGS. 2A–2D.

As described above, the present embodiment 5 can achieve the logical optimization and logical changes in design with considering the crosstalk information.

Embodiment 6

Figure 11:
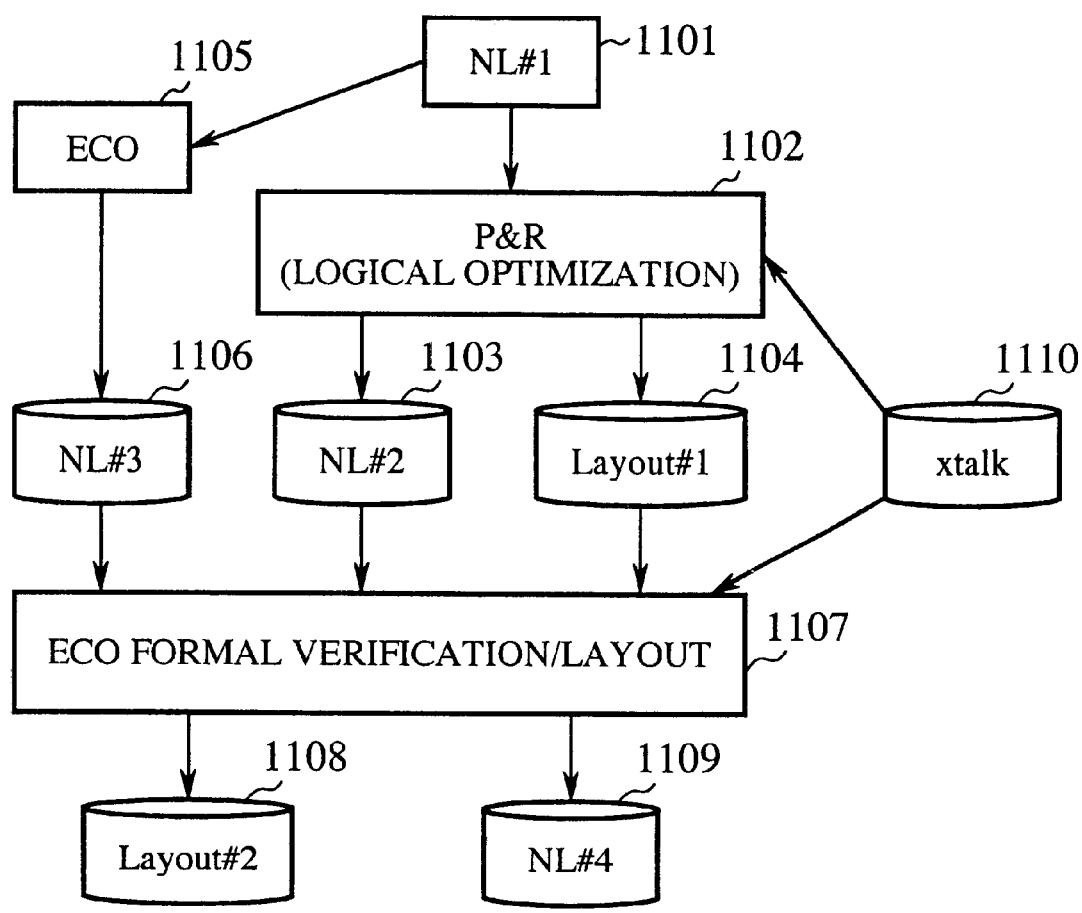
FIG. 11 is a flowchart illustrating an engineering-change method of a semiconductor circuit of an embodiment 6 in accordance with the present invention.

FIG. 11 is a flowchart illustrating an engineering-change method of a semiconductor circuit of an embodiment 6 in accordance with the present invention. The present embodiment 6 is an example of considering crosstalk information at the netlist changes in the foregoing embodiment 2. For example, the netlist changes are made by adjusting the cell driving strength to prevent the crosstalk problem.

In FIG. 11, the reference numeral 1101 designates an original netlist. A P&R process 1102 carries out the placement and routing using the netlist 1101, and netlist changes to meet the constraints such as timings. The crosstalk constraints and crosstalk library information on each cell and the like used in this case constitute crosstalk information 1110. The P&R process 1102 produces a changed netlist 1103 and a layout 1104. Subsequently, an ECO process 1105 makes logical changes because of design problems or the like. A netlist produced by the ECO process 1105 that makes logical changes of the netlist 1101 is a netlist 1106.

Subsequently, an ECO-formal verification/layout generating process 1107 conducts a formal verification of the netlists 1103 and 1106, and changes the netlist 1103 according to the verification results such that it becomes logically equivalent to the netlist 1106. In this case, the netlist changes are made by reading the crosstalk information 1110 to prevent the crosstalk problem. The resultant netlist produced by the changes is a netlist 1109. According to the results of the changes, the layout is implemented with verifying whether the changes of the layout are possible. The resultant layout is a layout 1108.

Figure 12A:
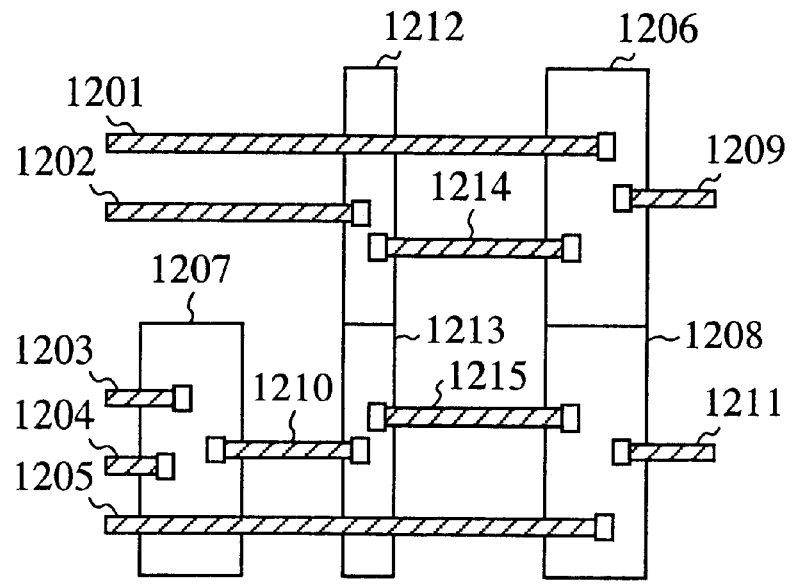
FIGS. 12A and 12B are diagrams illustrating examples of layout changes in the embodiment 6 in accordance with the present invention.
Figure 12B:
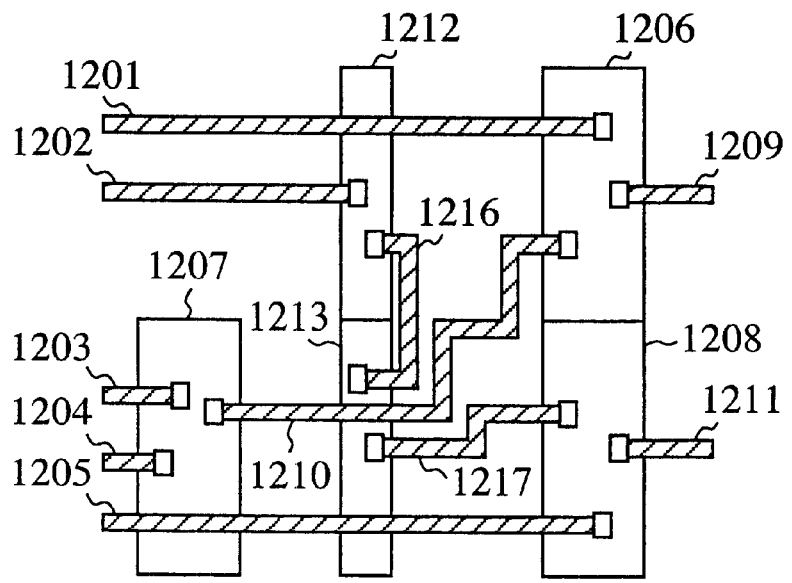

FIGS. 12A and 12B are diagrams showing an example of layout changes in the embodiment 6 in accordance with the present invention.

FIG. 12A illustrates a layout based on the netlist 1103 after the changes by the P&R process 1102. Reference numerals 1201–1205 each designate an input net. The net 1202 is input to a cell 1212, the output net of which is a net 1214. The nets 1201 and 1214 are input to a cell 1206, the output of which is a net 1209. The nets 1203 and 1204 are input to a cell 1207, the output of which is a net 1210. The net 1210 is input to a cell 1213, the output of which is a net 1215. The net 1215 and the net 1205 are input to a cell 1208, the output of which is a net 1211. FIG. 12A illustrates a result of carrying out the placement and routing of the netlist. The nets are drawn as segments of a wiring pattern on the layout, and the cells are drawn as a layout diagram of the cells.

FIG. 12B illustrates a layout 1108 implemented by the ECO-formal verification/layout generating process 1107. It is shown from FIG. 12B that the connections of the nets 1214 and 1215 are changed so that their wiring pattern is also changed. The changed result is nets 1216 and 1217. The net 1216 is the output of the cell 1212 and the input to the cell 1213, and the net 1217 is the output of the cell 1213 and the input to the cell 1208. The net 1210 is the output of the cell 1207, and is directly input to the cell 1206. The long wire length of the path from the net 1202 to the cell 1208 requires the buffers as repeaters that divide the net because the long wire is likely to arise the crosstalk problem. In contrast, as for the path from the cell 1207 to the cell 1206, it is not necessary for the buffers to be inserted therein because the two cells are placed close to each other, and hence the crosstalk problem is unlikely to occur. Thus, the interconnections between them differ from those of FIGS. 4A and 4B.

As described above, the present embodiment 6 can achieve the logical optimization and logical changes in design with considering the crosstalk information.

Embodiment 7

Figure 13:
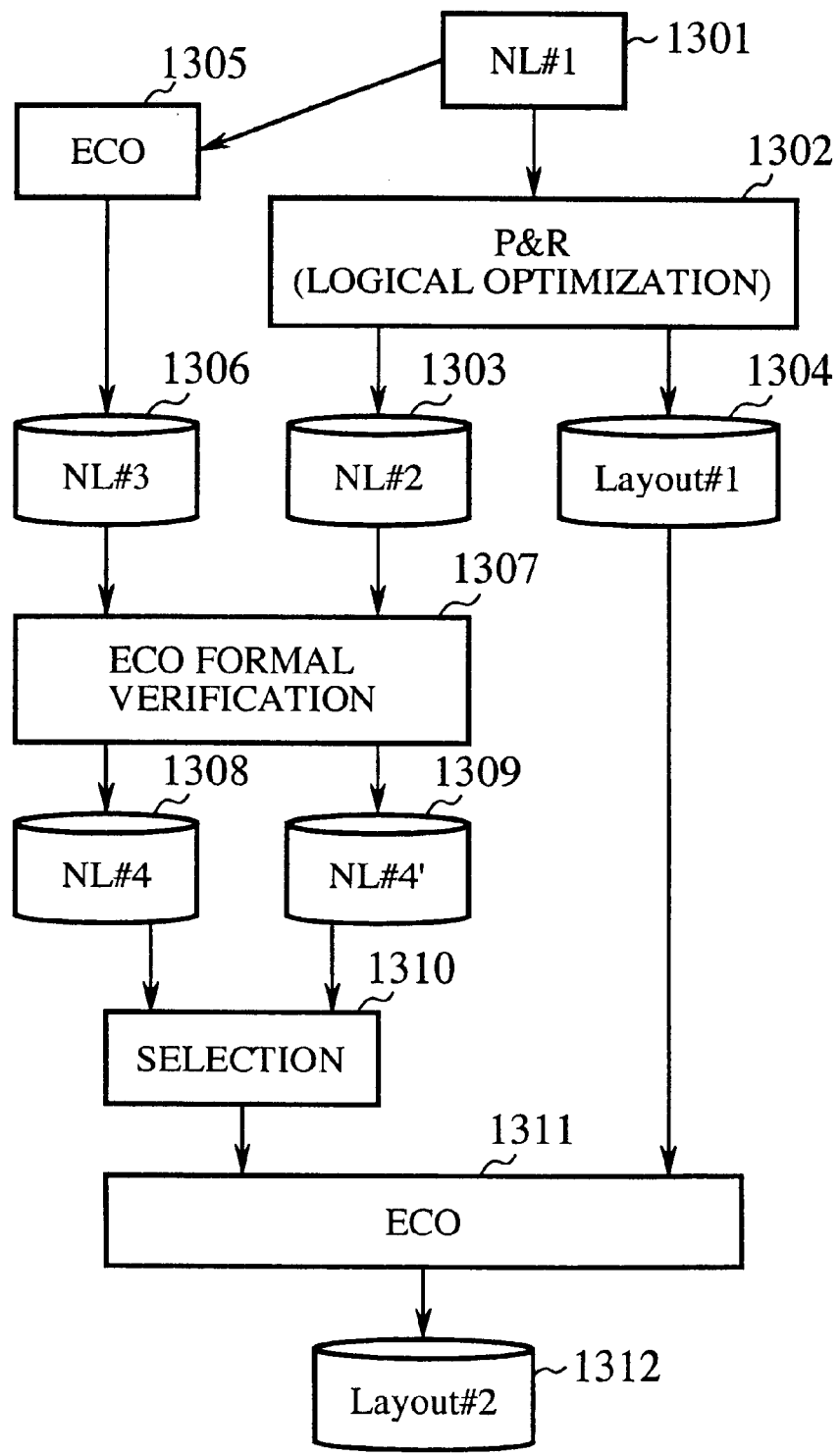
FIG. 13 is a flowchart illustrating an engineering-change method of a semiconductor circuit of an embodiment 7 in accordance with the present invention.

FIG. 13 is a flowchart illustrating an engineering-change method of a semiconductor circuit of an embodiment 7 in accordance with the present invention. The present embodiment 7 is an example in which a user can make a choice among two or more alternatives produced by the netlist changes in the foregoing embodiment 1.

In FIG. 13, the reference numeral 1301 designates an original netlist. A P&R process 1302 carries out the placement and routing using the netlist 1301, and netlist changes to meet the constraints such as timings. The P&R process 1302 produces a changed netlist 1303 and a layout 1304. Subsequently, an ECO process 1305 makes logical changes because of design problems or the like.

The present invention is not necessary when the logical changes are performed for the netlist 1303. However, when a layout engineer differs from a logic designer, or when the netlist 1303 after the P&R process 1302 is difficult to read, it is sometimes necessary for the netlist 1301 to undergo the logical changes. The resultant netlist produced by the ECO process 1305 that makes the logical changes of the netlist 1301 is a netlist 1306.

Subsequently, an ECO-formal verification process 1307 conducts the formal verification of the netlists 1303 and 1306, and changes the netlist 1303 according to the verification results, such that the netlist 1303 becomes logically equivalent to the netlist 1306. The netlist produced by the changes is a netlist 1308 and a netlist 1309. Although the two netlists are provided here as a result of the changes, there are sometimes provided three or more netlists. The user selects one of these netlist results at a selection process 1310. When the user selects the netlist 1308, for example, the netlist 1308 and the layout 1304 undergo partial layout changes by an ECO process 1311 which is a conventional placement and routing tool. The layout produced by the changes is a layout 1312.

As for an actual example of the netlist changes, since it is the same as that of FIGS. 2A–2D, the description thereof is omitted here.

As described above, the present embodiment 7 enables a user to freely select one of the netlists 1308 and 1309, thereby increasing the convenience of the user with facilitating the design changes.

Embodiment 8

Figure 14:
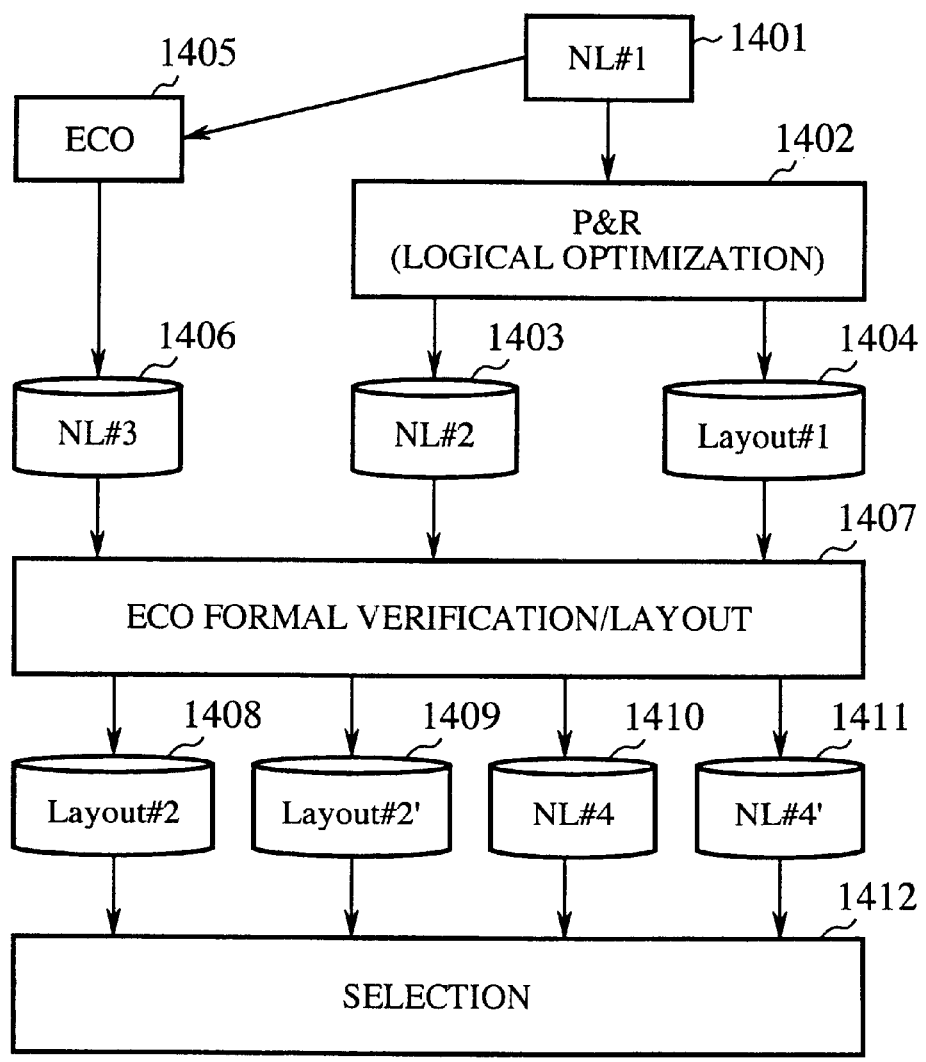
FIG. 14 is a flowchart illustrating an engineering-change method of a semiconductor circuit of an embodiment 8 in accordance with the present invention.
Figure 15:
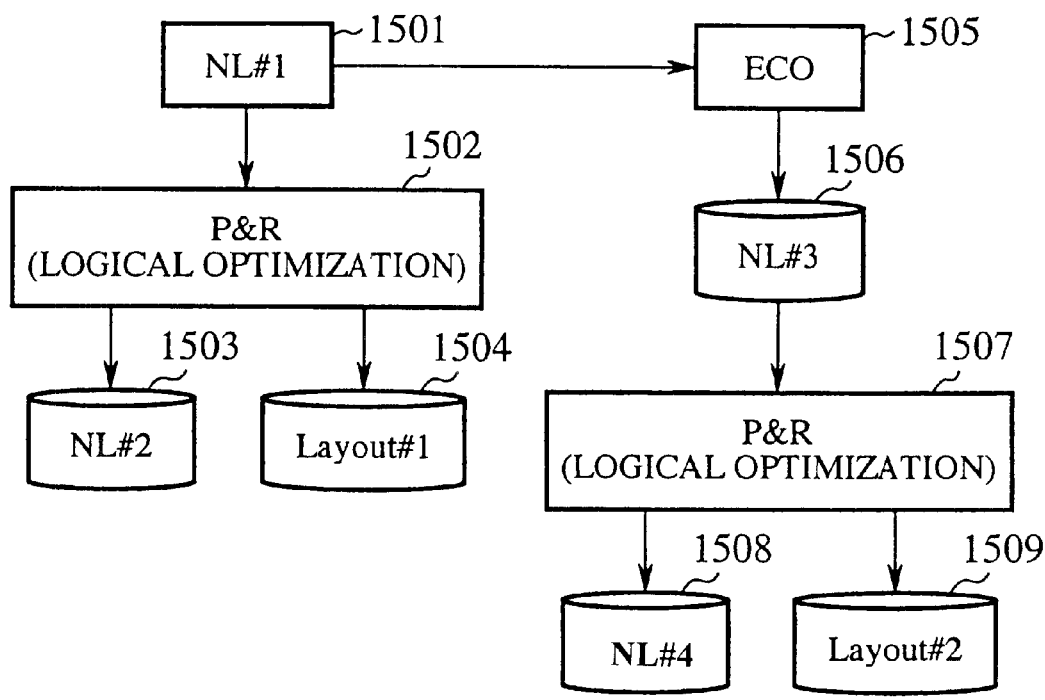
FIG. 15 is a flowchart illustrating a conventional engineering-change method of a semiconductor circuit.

FIG. 14 is a flowchart illustrating an engineering-change method of a semiconductor circuit of an embodiment 8 in accordance with the present invention. The present embodiment 8 is an example in which a user can make a choice among two or more alternatives produced by the netlist changes in the foregoing embodiment 2.

In FIG. 14, the reference numeral 1401 designates an original netlist. A P&R process 1402 carries out the placement and routing using the netlist 1401, and netlist changes to meet the constraints such as timings. The P&R process 1402 produces a changed netlist 1403 and a layout 1404. Subsequently, an ECO process 1405 makes logical changes because of design problems or the like.

The present invention is not necessary when the logical changes are performed for the netlist 1403. However, when a layout engineer differs from a logic designer, or when the netlist 1403 after the P&R process 1402 is difficult to read, it is sometimes necessary to make the logical changes of the netlist 1401. The resultant netlist produced by the ECO process 1405 that makes the logical changes of the netlist 1401 is a netlist 1406.

Subsequently, an ECO-formal verification/layout generating process 1407 conducts a formal verification of the netlist 1403 and the netlist 1406, and changes the netlist 1403 according to the verification results, such that the netlist 1403 becomes logically equivalent to the netlist 1406.

According to the results of the changes, the layout is carried out along with the verification whether the changes involved in the layout are possible. The results of the layout are layouts 1408 and 1409, and the netlists produced by the changes are netlists 1410 and 1411. Although two layouts and two netlists are provided here as the results of the changes, there are sometimes provided three or more of them. In addition, since a plurality of layouts can be provided for a single netlist, the number of the layouts is equal to or greater than the number of the netlists. Then, the user selects a set of a layout and a netlist from the alternatives at a selection process 1412.

Although the netlist and the layout are selected at the same time in the present embodiment 8, it is not essential. For example, it is possible to select the netlist first, and then to carry out the layout only for the selected netlist by the ECO-formal verification/layout generating process 1407, and to select the layout thereafter.

An example of the changes in the netlist is the same as that of FIGS. 2A–2D, and an example of the changes in the layout is the same as that of FIGS. 4A and 4B, the description thereof is omitted here.

As described above, the present embodiment 8 enables the user to freely select a desired pair from the layouts 1408 and 1409, and from the netlists 1410 and 1411, thereby increasing the convenience of the user with facilitating the design changes.

What is claimed is:

1. An engineering-change method of a semiconductor circuit comprising:

a placement and routing step of carrying out placement and routing and logical optimization using a first netlist to generate a second netlist and a first layout that undergoes logical optimization wherein the first layout is generated without verification of the second netlist;

an engineering-change step of making logical changes in design for the first netlist to generate a third netlist;

an engineering-change and formal verification step of conducting formal verification of the second netlist and the third netlist to generate a fourth netlist by changing the second netlist such that the fourth netlist becomes logically equivalent to the third netlist; and a layout generating step of generating a second layout by changing the first layout such that the second layout matches the fourth netlist.

2. An engineering-change method of a semiconductor circuit comprising:

a placement and routing step of carrying out placement and routing and logical optimization using a first netlist to generate a second netlist and a first layout that undergoes logical optimization wherein the first layout is generated without verification of the second netlist;

an engineering-change step of making logical changes in design for the first netlist to generate a third netlist;

an engineering-change and formal verification/layout generating step of conducting formal verification of the second netlist and the third netlist to generate a fourth netlist by changing the second netlist such that the fourth netlist becomes logically equivalent to the third netlist, and of generating a second layout by changing the first layout such that the second layout matches the fourth netlist.

3. The engineering-change method of a semiconductor circuit according to claim 1, wherein the placement and routing step generates the second netlist and the first layout to satisfy timing constraints or timing information including timing library information on each cell, and wherein the engineering-change and formal verification step generates the fourth netlist such that it satisfies the timing constraints or timing information.

4. The engineering-change method of a semiconductor circuit according to claim 2, wherein the placement and routing step generates the second netlist and the first layout to satisfy timing constraints or timing information including timing library information on each cell, and wherein the engineering-change and formal verification/layout generating step generates the fourth netlist such that it satisfies the timing constraints or timing information.

5. The engineering-change method of a semiconductor circuit according to claim 1, wherein the placement and routing step generates the second netlist and the first layout to satisfy crosstalk constraints or crosstalk information including crosstalk library information on each cell, and wherein the engineering-change and formal verification step generates the fourth netlist such that it satisfies the crosstalk constraints or crosstalk information.

6. The engineering-change method of a semiconductor circuit according to claim 2, wherein the placement and routing step generates the second netlist and the first layout to satisfy crosstalk constraints or crosstalk information including crosstalk library information on each cell, and wherein the engineering-change and formal verification/layout generating step generates the fourth netlist such that it satisfies the crosstalk constraints or crosstalk information.

7. The engineering-change method of a semiconductor circuit according to claim 1, further comprising a selection step of selecting, when the engineering-change and formal verification step generates a plurality of fourth netlists, one of the plurality of fourth netlists.

8. The engineering-change method of a semiconductor circuit according to claim 2, further comprising a selection step of selecting, when the engineering-change and formal verification/layout generating step generates a plurality of fourth netlists, one of the plurality of fourth netlists.

* * * * *